United States Patent
Yokokawa

(10) Patent No.: US 8,906,708 B2
(45) Date of Patent: Dec. 9, 2014

(54) METHOD FOR CHECKING ION IMPLANTATION CONDITION AND METHOD FOR MANUFACTURING SEMICONDUCTOR WAFER

(75) Inventor: Isao Yokokawa, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/638,792

(22) PCT Filed: Mar. 28, 2011

(86) PCT No.: PCT/JP2011/001817
§ 371 (c)(1),
(2), (4) Date: Oct. 1, 2012

(87) PCT Pub. No.: WO2011/135775
PCT Pub. Date: Nov. 3, 2011

(65) Prior Publication Data
US 2013/0023069 A1      Jan. 24, 2013

(30) Foreign Application Priority Data

Apr. 26, 2010    (JP) .................................. 2010-101399

(51) Int. Cl.
| | | |
|---|---|---|
| *H01L 21/66* | (2006.01) | |
| *H01L 21/265* | (2006.01) | |
| *H01J 37/30* | (2006.01) | |
| *H01J 37/317* | (2006.01) | |

(52) U.S. Cl.
CPC ............ *H01L 21/265* (2013.01); *H01J 37/3005* (2013.01); *H01J 37/3171* (2013.01); *H01L 22/12* (2013.01); *H01J 2237/31703* (2013.01); *H01J 2237/2445* (2013.01)
USPC ......................... 438/16; 438/14; 257/E21.248

(58) Field of Classification Search
USPC ............ 438/519, 914; 257/E21.057, E21.147
See application file for complete search history.

(56) References Cited

U.S. PATENT DOCUMENTS

| | | | |
|---|---|---|---|
| 2008/0128621 | A1 | 6/2008 | Berry |
| 2009/0081849 | A1 | 3/2009 | Yamazaki et al. |
| 2009/0093102 | A1 | 4/2009 | Moriwaka |

FOREIGN PATENT DOCUMENTS

| | | |
|---|---|---|
| JP | A-2008-186801 | 8/2008 |
| JP | A-2009-076771 | 4/2009 |
| JP | A-2009-105391 | 5/2009 |

OTHER PUBLICATIONS

International Preliminary Report on Patentability Issued in Application No. PCT/JP2011/001817; Dated Nov. 6, 2012 (With Translation).
International Search Report issued in Application No. PCT/JP2011/001817; Dated Jun. 21, 2011 (With Translation).
Japanese Office Action issued in Application No. 2010-101399; Dated Sep. 17, 2013 (With Partial English-language translation).
Fitting et al., "Cathodoluminescence of wet, dry, and hydrogen-implanted silica films", *Journal of Non-Crystalline Solids*, Aug. 15, 2005, pp. 2251-2262, vol. 351, No. 27-29.

(Continued)

*Primary Examiner* — Cheung Lee
(74) *Attorney, Agent, or Firm* — Oliff PLC

(57) ABSTRACT

A method for checking an ion implantation condition when ions are implanted over an entirety of one surface of a semiconductor wafer having an insulator film on the one surface, the method including checking whether the ions are implanted over the entirety of the one surface of the semiconductor wafer by directly or indirectly observing light emitted when the one surface of the semiconductor wafer is irradiated with an ion beam of the implanted ions throughout the ion implantation.

14 Claims, 6 Drawing Sheets

(56) References Cited

OTHER PUBLICATIONS

Shimizu-Iwayama et al., "Visible photoluminescence in Si+—implanted thermal oxide films on crystalline Si", *Applied Physics Letters*, Oct. 3, 1994, pp. 1814-1816, vol. 65, No. 14.

Townsend et al., "Optical Effects of Ion Implantation", *Reports on Progress in Physics*, May 1, 1987, pp. 501-558, vol. 50, No. 5.

Bryant, "Ion Implantation and Luminescence", *Radiation Effects*, Jan. 1, 1982, pp. 81-93, vol. 65, No. 1-4.

Sep. 30, 2014 Extended European Search Report issued in European Application No. 11 77 4566.1.

METHOD FOR CHECKING ION IMPLANTATION CONDITION AND METHOD FOR MANUFACTURING SEMICONDUCTOR WAFER

TECHNICAL FIELD

The present invention relates to a method for checking an ion implantation condition when ions are implanted into a semiconductor wafer, and a method for manufacturing a semiconductor wafer utilizing the same.

BACKGROUND ART

Processes of forming semiconductor devices and of manufacturing semiconductor wafers include an ion implantation process. In the ion implantation process, a desired element is ionized and the resultant is added into a semiconductor wafer.

In typical ion implantation operation, n-type impurities such as arsenic, phosphorus, and antimony, or p-type impurities such as boron, which are impurities of a dopant type, are implanted from a surface of a semiconductor wafer with an ion implantation apparatus to form n-type or p-type semiconductor region.

In comparison with a diffusion method of adding impurities, the ion implantation method, which has been widely used as a method of adding impurities of a dopant type, has advantages that a photoresist can be used as a mask, the amount of impurities and an ion implantation depth can be accurately controlled, and the spread of impurities in a lateral direction can be inhibited.

When light elements such as hydrogen are implanted from the surface of a semiconductor wafer (a bond wafer), the wafer is bonded to a base wafer as a foundation through an insulator film, and the resultant bonded wafer is then subjected to a heat treatment and so on, the bond wafer is delaminated at a ion-implanted layer due to a function of the light elements implanted into the semiconductor wafer, and consequently a semiconductor thin film layer is transferred on the base wafer.

This method is referred to as the ion implantation delamination method (also referred as to the SMART-CUT (a registered trademark) method) and used to manufacture an SOI (Silicon On Insulator) wafer.

The basic principle of the ion implantation apparatus used in the ion implantation is that a source gas containing a desired implanted species is ionized by the arc discharge or microwave discharge and the ions are accelerated with an electric field. The track of the accelerated ions is bent with a magnetic field in a mass spectrograph to separate the implanted species and an unnecessary charged species. Only the implanted species extracted in this manner is implanted from the surface of the semiconductor wafer. The ion implantation depth of the implanted species is adjusted by accurate control of accelerating voltage and its implantation amount is adjusted by accurate control of beam current.

Since the implanted species, i.e. ions, are implanted in the form of a beam, implanting ions over the entirety of the wafer surface requires beam scanning or wafer movement.

The ion implantation apparatus is divided into a batch type apparatus (See FIG. 1), implanting ions simultaneously into a plurality of wafers, and a single wafer processing type apparatus, implanting ions into a wafer.

For example, as shown in FIG. 1, the batch type ion implantation apparatus 10 takes out ions produced from an ion source 16 by applying the electric field and accelerate the ions with a first accelerator 17a. In the apparatus, a mass spectrograph 15 then conducts a mass analysis with the magnetic field to extract only ions having a predetermined mass. A second accelerator 17b further applies the electric field to accelerate the ions for the second time (second acceleration). The ion beam 18 accelerated in this manner is irradiated to the surface of the semiconductor wafers W in a chamber 14.

Here, the semiconductor wafers W are placed on a wafer supporting member. In the wafer supporting member, the semiconductor wafers W are lined up and disposed on a wheel 11, which is a circumference portion having a certain radius. The wheel 11 is rotated about a wheel center 11a at a high speed, e.g., a rotational speed of 800 to 900 rpm and a peripheral speed of 50 m/sec, so that ions can be implanted into the wafer plane uniformly in the direction of the circumference of the wheel 11.

On the other hand, there are two methods for implanting ions in the direction of the radius of the wheel as follows: (1) the wheel is radially moved while the beam is fixed; (2) beam scanning in the direction of the radius of the wheel is performed but the wheel is not radially moved. The scanning speeds in a radial direction in both methods are low, e.g., 1 to 10 cm/sec.

Similarly with the batch type ion implantation apparatus, the single wafer processing type apparatus radially moves a wafer supporting member or performs beam scanning in a radial direction so that ions can be implanted over the entirety of the wafer surface.

When the implanted species are needed to be uniformly implanted over the entirety of the surface of the semiconductor wafer in the ion implantation operation, the implanted species may be non-uniformly implanted due to the state of the ion beam, malfunction of the apparatus, and so on.

Patent Document 1 discloses that, when ion implantation concentration varies in the wafer plane during hydrogen ion implantation, a cleavage plane may become uneven reflecting the variation.

CITATION LIST

Patent Literature

Patent Document 1:Japanese Unexamined Patent publication (Kokai) No. 2009-76771

SUMMARY OF INVENTION

Technical Problem

With regard to a method for checking uniformity of the ion implantation, when the implanted element is a dopant-type impurity element such as boron, arsenic, phosphorus, and antimony, the uniformity in the wafer plane can be evaluated by performing a heat treatment to activate it after the ions are implanted into the wafer and measuring a sheet resistance.

When non-dopant-type ion species, such as hydrogen and helium, are implanted, however, the uniformity of the ion implantation in the wafer plane cannot be evaluated on the wafer because the uniformity cannot be evaluated by the sheet resistance. It is therefore difficult to find the presence of non-uniformity implantation and a lot of inferior wafers are manufactured in the meantime.

In the case of such a element making it impossible to measure the sheet resistance, the implantation amount can be measured by the other measurement methods such as the SIMS method (Second Ion Mass Spectrometry) and the photoluminescence method. In these method, however, there are problems in that they are destructive test, measurement of a radial distribution takes a lot of time, and measurement accuracy is not insufficient (a limit of approximately ±5% in a plane).

In the case of a dopant-type ion species making it possible to measure the sheet resistance, the presence of non-uniformity can be readily found. However, it is difficult to find the cause and it takes a lot of time to find the cause. There is therefore a problem in that taking a lot of time to solve the cause decreases productivity.

The present invention was accomplished in view of the above-described problems, and its object is to provide a method for checking an ion implantation condition that enables early and easy detection of non-uniformity of the ion implantation due to a malfunction of an apparatus and so on in the ion implantation operation and thereby enables stability of production quality and reduction in the period of the malfunction. The object is also to provide a method for manufacturing a semiconductor wafer utilizing the checking method.

Solution to Problem

To solve the foregoing problems, the present invention provides a method for checking an ion implantation condition when ions are implanted over an entirety of one surface of a semiconductor wafer having an insulator film on the one surface, the method comprising checking whether the ions are implanted over the entirety of the one surface of the semiconductor wafer by directly or indirectly observing light emitted when the one surface of the semiconductor wafer is irradiated with an ion beam of the implanted ions throughout the ion implantation.

As described above, when ions are implanted into the semiconductor wafer, a condition of irradiating with the beam cannot be checked. However, when the ions are implanted into a semiconductor wafer having an insulator film formed thereon, light is emitted for a certain time at a region on the surface of the semiconductor wafer irradiated with the beam. The region on the semiconductor wafer irradiated with the beam during the ion implantation can be regarded as a light emission region by utilizing the phenomenon of emitting light. It is possible to check whether the ions are implanted over the entirety of the surface of the semiconductor wafer as planned from changes in the light emitting region. It is also possible to readily find that the implantation is not performed as planned, that is, whether the ion implantation apparatus used in the ion implantation has a malfunction.

According to the present invention, therefore, the irradiating condition of the ion beam during the ion implantation can be readily checked even though the non-dopant-type ions are implanted. In addition, the cause of a problem can be found in a short time and a time required for solving the problem can be reduced. The quality of the semiconductor wafer can be therefore stabilized and the productivity can be prevented from decreasing.

In the method, at least one of hydrogen ions, heavy hydrogen ions, and helium ions can be used as the ions.

The light elements as above are commonly used as implanted ions in manufacture of an SOI wafer by the SMART-CUT method, for example. The SMART-CUT method requires uniformly implanting ions over the entirety of the surface of the semiconductor wafer, i.e. the bond wafer, to ensure flatness of an SOI layer after delamination.

Concerning the requirement, the method for checking an ion implantation condition of the present invention enables readily and surely checking whether the ions are implanted over the entirety of the surface of the semiconductor wafer even though the non-dopant-type ion species are implanted.

A batch-type ion implantation apparatus is preferably used to implant the ions and the emitted light is preferably directly observed in such a manner that the surface of the semiconductor wafer is observed through an observation window provided on a chamber of the batch-type ion implantation apparatus while the surface is irradiated with the ion beam.

When the emitted light (the condition of irradiating with the ion beam), in the ion implantation with the batch-type ion implantation apparatus, is directly observed through the observation window provided on the chamber of the ion implantation apparatus, it is possible to surely check whether the ions are implanted over the entirety of the surface of the semiconductor wafer as planned. The presence of failure in the ion implantation operation can be more surely found and a countermeasure against the failure can be started quickly, as need.

The observation of the surface of the semiconductor wafer through the observation window is preferably performed at a position angularly spaced at an angle of 90° to 270° from an irradiation position of the ion beam with respect to a center of a wheel on which the semiconductor wafer is placed.

The structural limitation of the apparatus may make it difficult to directly observe through the observation window the region into which the ions are implanted. However, when the observation of the surface of the semiconductor wafer through the observation window is performed at a position angularly spaced at an angle of 90° to 270° from an irradiation position of the ion beam with respect to a center of a wheel on which the semiconductor wafer is placed, it is possible to judge whether the entirety of the surface of the semiconductor wafer is irradiated with the ion beam even though the movement of the wheel is not fully seen or the size of the observation window is too small to find a position of irradiating with the ion beam.

Moreover, the emitted light is preferably directly observed in such a manner that the surface of the semiconductor wafer is observed with a camera provided in a chamber for implanting the ions while the surface is irradiated with the ion beam.

The observation with the provided camera reduces provability of failure of check as much as possible, enabling the ion implantation condition to be more surely checked.

The emitted light can be indirectly observed with an illuminometer provided in a chamber for implanting the ions. Alternatively, the emitted light can also be indirectly observed with an illuminometer provided at a position at which the emitted light can be observed through an observation window provided on a chamber for implanting the ions.

When the condition of the light emitted on the semiconductor wafer during the ion implantation is indirectly observed either with the illuminometer provided in the chamber or with the illuminometer through the observation window provided on the chamber, it is possible to check whether the entirety of the surface of the semiconductor wafer is irradiated with the ion beam.

Furthermore, the present invention provides a method for manufacturing a semiconductor wafer comprising the step of implanting ions, wherein the ions are implanted into the semiconductor wafer while the semiconductor wafer is observed by the method for checking an ion implantation condition of the present invention in the step of implanting the ions.

As described above, the method for checking an ion implantation condition of the present invention enables readily and surely checking whether the entirety of the surface of the semiconductor wafer is irradiated with the ion beam.

In the semiconductor wafer manufacture including the ion implantation process, checking whether the entirety of the surface of the semiconductor wafer is irradiated with the ion beam according to the inventive method for checking an ion implantation condition enables reduction in the incidence of failure caused by the ion implantation process in comparison with conventional methods, thereby improving the product yield.

Advantageous Effects of Invention

As described above, the present invention provides a method for checking an ion implantation condition that enables early and easy detection of non-uniformity of the ion implantation due to the malfunction in the apparatus and so on in the ion implantation operation and thereby enables stability of production quality and reduction in the period of the malfunction. The present invention also provides a method for manufacturing a semiconductor wafer utilizing the checking method.

DESCRIPTION OF EMBODIMENTS

Hereinafter, the present invention will be described in detail with reference to the drawings, but the present invention is not limited thereto.

In the method for checking an ion implantation condition of the present invention, first, an insulator film is formed on a surface of a semiconductor wafer into which ions are to be implanted.

Examples of the insulator film formed herein include an oxide film. A method for forming the film is not limited and a common method may be used to form it.

Next, desired ions, such as light element ions, are implanted into the surface of the semiconductor wafer after forming the insulator film. During the ion implantation, light is emitted at a portion on the semiconductor wafer surface irradiated with the ion beam of the implanted ions. The emitted light is observed directly or indirectly to check whether the ions are implanted over the entirety of the surface of the semiconductor wafer.

In the case of a silicon single crystal wafer, for example, a silicon oxide film, as the insulator film, is formed on the surface of the silicon single crystal wafer, and the wafer is then irradiated with a hydrogen beam as the ion beam.

Normally, a window (an observation window) through which the interior of the ion implantation apparatus can be observed is not formed on a beam line for safety. However, a viewing window (observation window) that enables the interior of the apparatus to be observed can be formed at a position spaced from the beam line in the batch-type ion implantation apparatus, for example.

Figure 1:
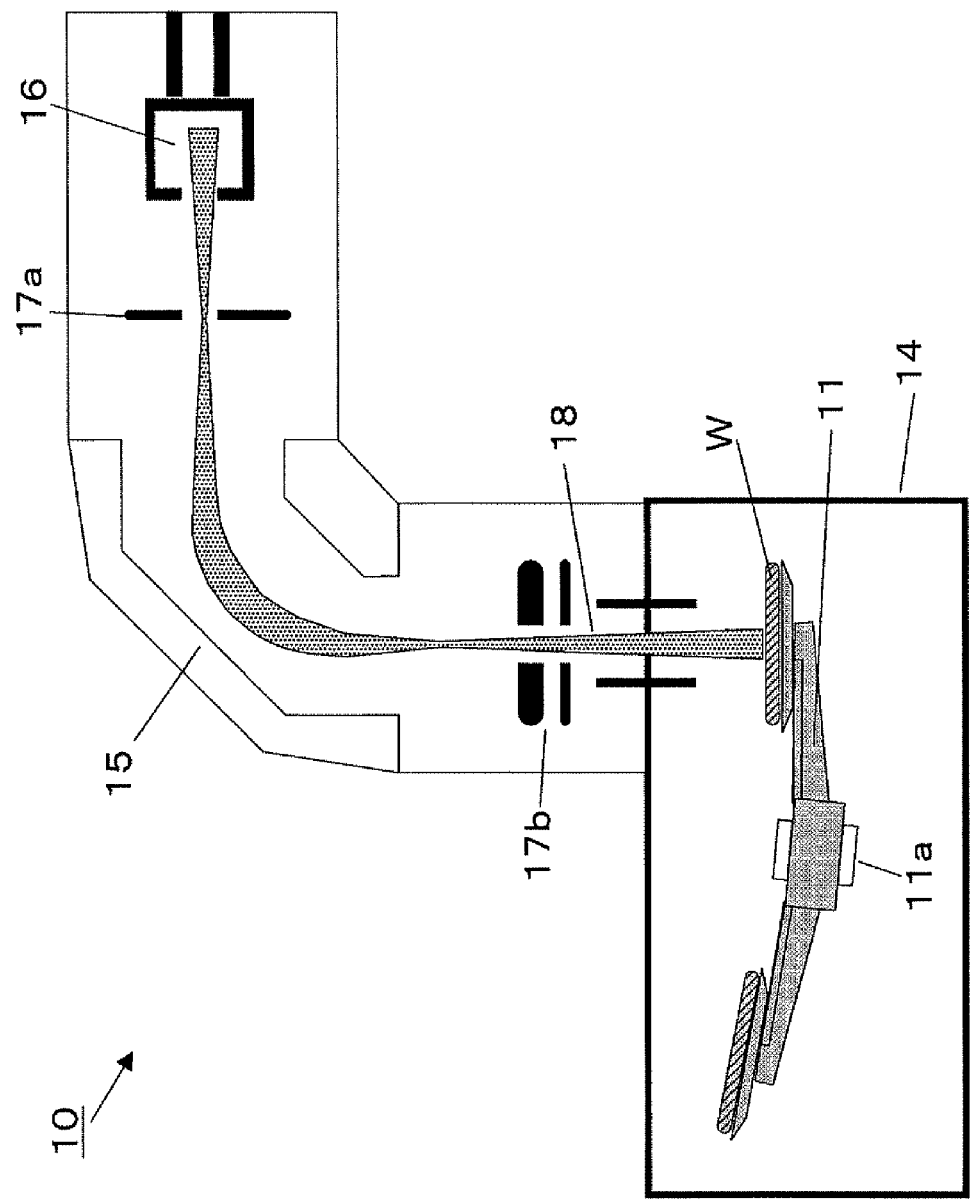
FIG. 1 is a schematic view showing an example of the batch-type ion implantation apparatus.
Figure 2:
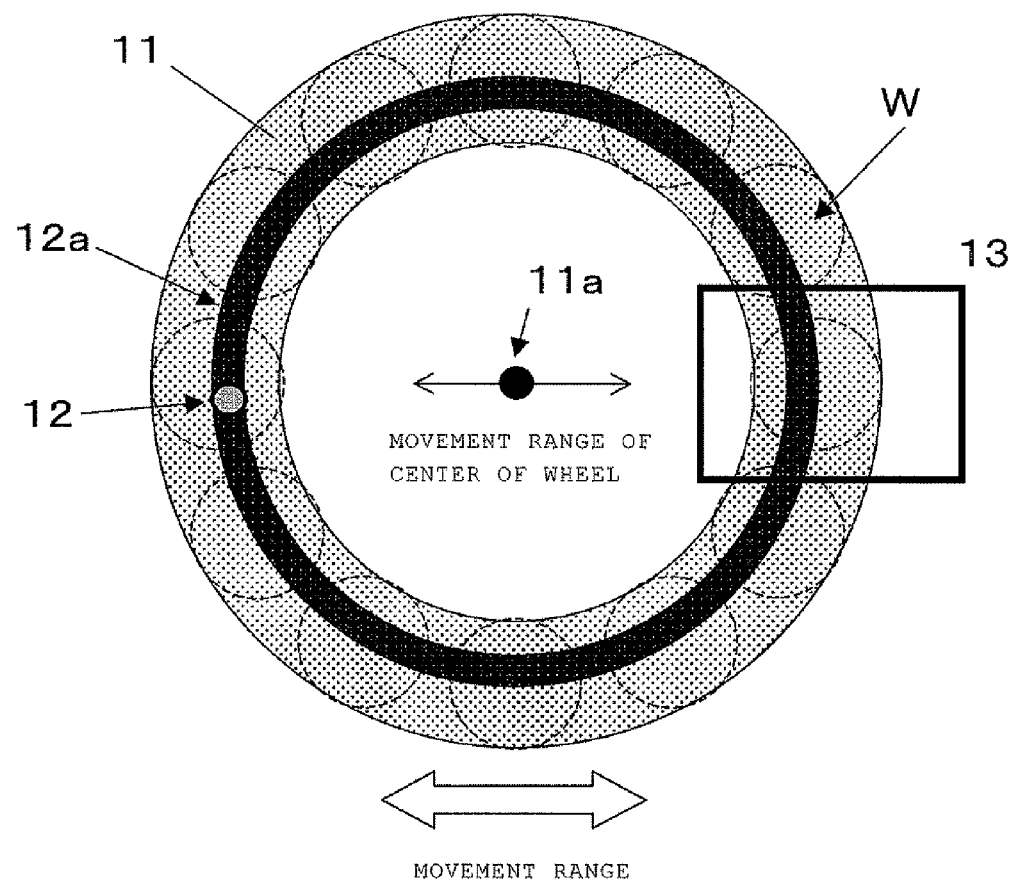
FIG. 2 is a schematic view showing an example of how ions are implanted into silicon single crystal wafers with the batch-type ion implantation apparatus.

As shown in FIG. 2, for example, the observation window 13 is accordingly provided such that a position rotated at 180°, about the center 11a of the wheel 11 on which the silicon single crystal wafer W is placed, from the position 12 on the silicon single crystal wafer W irradiated with the hydrogen beam during the hydrogen ions implantation can be checked; thereby the situations of rotating the wheel 11 at a high speed and of moving the wheel 11 horizontally can be directly checked through the observation window 13.

When the hydrogen ions are implanted into the silicon single crystal wafer W having the silicon oxide film, a line of belt 12a glowing blue in the direction of rotating the wheel 11 can be observed at the position on the wafer irradiated with the ion beam through the observation window 13. It can be understood that the phenomenon of the emitted light occurs due to excitation of the silicon oxide film when the hydrogen ions pass through the silicon oxide film.

Figure 3:
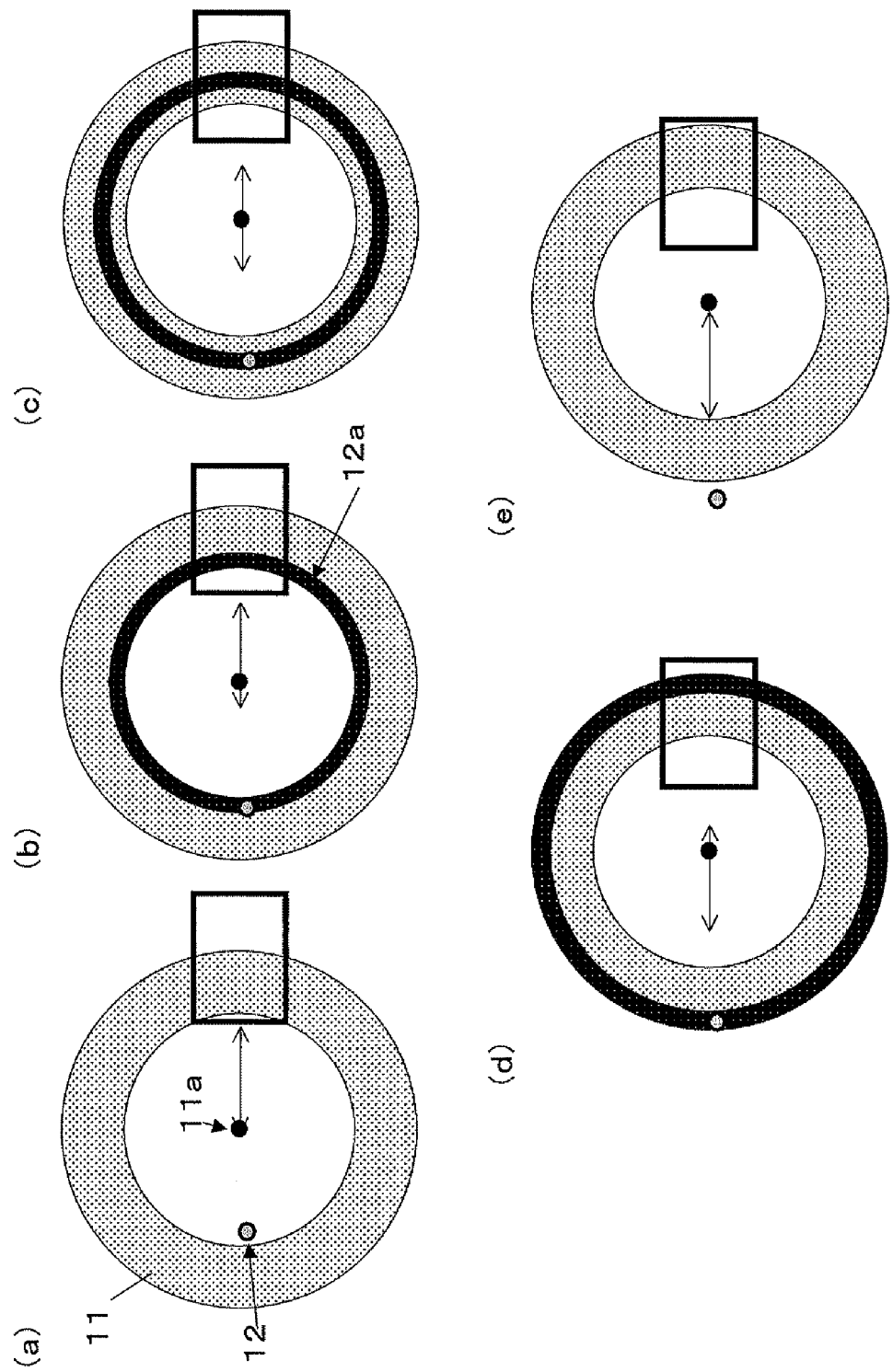
FIG. 3 includes schematic views of another example of how ions are implanted into silicon single crystal wafers with the batch-type ion implantation apparatus.

As shown in FIG. 3 at (a) to (e), moving the wheel 11 or the ion beam horizontally enables horizontal movement of the belt to be observed.

For example, when the wheel works properly, the belt glowing blue smoothly moves horizontally (FIG. 3 (a)→(b) →(c)→(d)→(e)→(d)→(c)→(b)→(a)→(b)→ . . . repeated).

The beam passes through the wheel every direction of scanning the wafer. When the movement of the wheel is reversed, therefore the belt glowing blue completely disappears from the wheel (See in FIG. 3 at (a) and (e)).

Either the ion beam or the wheel working improperly causes abnormal operation: the ion beam scanning suddenly increases in speed or stops momentarily, resulting in irregularity of the belt 12a glowing blue.

Accordingly, the abnormal phenomenon in the ion implantation can be readily observed, and it is possible to check whether the ions are implanted over the entirety of the surface of the silicon single crystal wafer.

Figure 4:
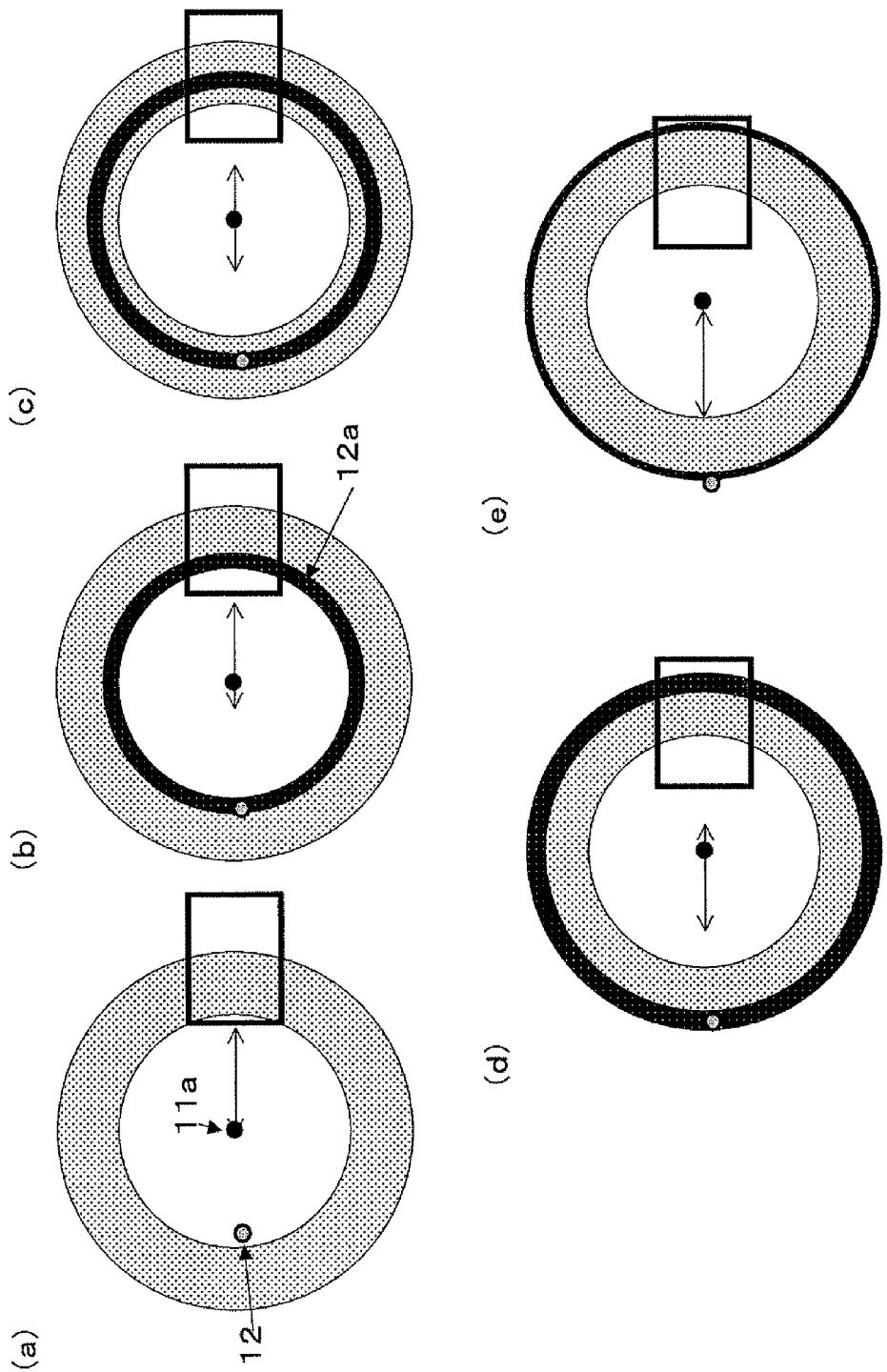
FIG. 4 includes schematic views of another example of how ions are implanted into silicon single crystal wafers with the batch-type ion implantation apparatus.

As shown in FIG. 4 at (a) to (e), when the movement of the wheel is reversed at a position deviated from a proper position, the movement of the wheel is reversed before the beam completely passes through the wafer (See FIG. 4 at (e)).

Specifically, the movement of the wheel is reversed in a state where a line of the blue light remains on the silicon single crystal wafer. In this state, the total time of ion implantation at the region where the blue light remains is shorter than other regions, and therefore a lack of the implantation amount occurs at the region.

According to the present invention, however, observing the emitted light at the irradiation position of the ion beam during the ion implantation enables prediction of failure, such as inability to obtain desired characteristics and deterioration in surface roughness on a delaminated surface in delamination. In addition, it is possible to comprehend in a short time that the failure is caused by the malfunction of a movement system of the wheel.

According to the present invention, thus, abnormal scanning movement with the ion beam during the ion implantation can be readily detected, and the cause of failure can be readily found. The present invention also enables rapid response to the cause to prevent productivity from decreasing, and reduce in the incidence of failure.

The observation of the surface of the silicon single crystal wafer W through the observation window 13 can be performed at a position angularly spaced at an angle of 90° to 270° from an irradiation position 12 of the ion beam with respect to the center 11a of the wheel 11 on which the semiconductor wafer is placed.

The structural limitation of the apparatus may make it difficult to directly observe through the observation window the region into which the ions are implanted. As shown in FIG. 2 (in the case of the position spaced at 180°), for example, when the observation of the surface of the semiconductor wafer through the observation window is performed at the position angularly spaced at an angle of 90° to 270° from the irradiation position of the ion beam with respect to the center of the wheel on which the semiconductor wafer is placed, it is possible to surely check whether the ions are implanted over the entirety of the surface of the semiconductor wafer even though the movement of the wheel is not fully seen and the size of the observation window is too small to find the irradiation position with the ion beam.

Since a spaced angle of 90° to 270° reduces the probability of the structural limitation of the apparatus, the inventive method has an advantage in being readily implemented.

Figure 5:
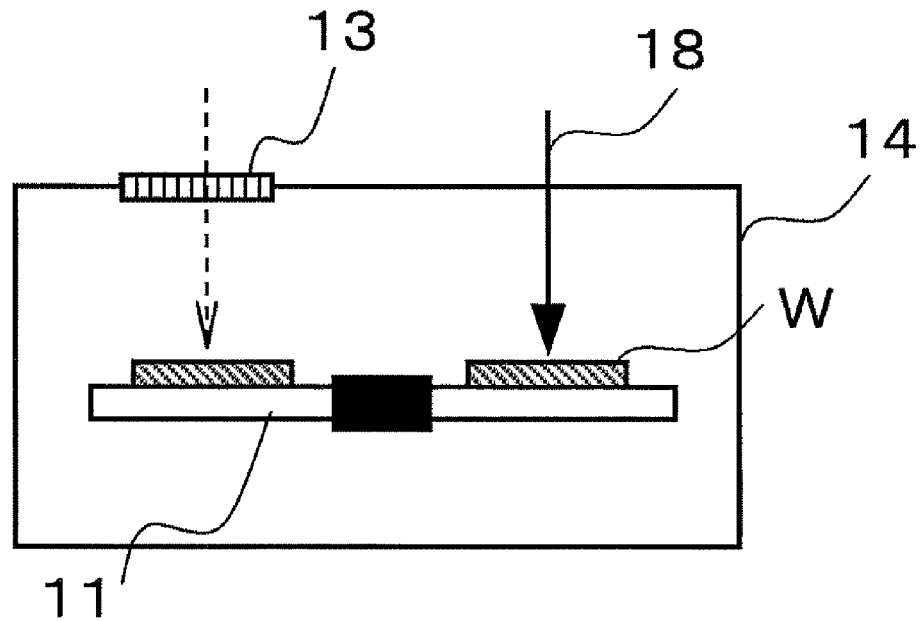
FIG. 5 is a schematic view of an embodiment of the method for checking an ion implantation condition of the present invention.
Figure 6:
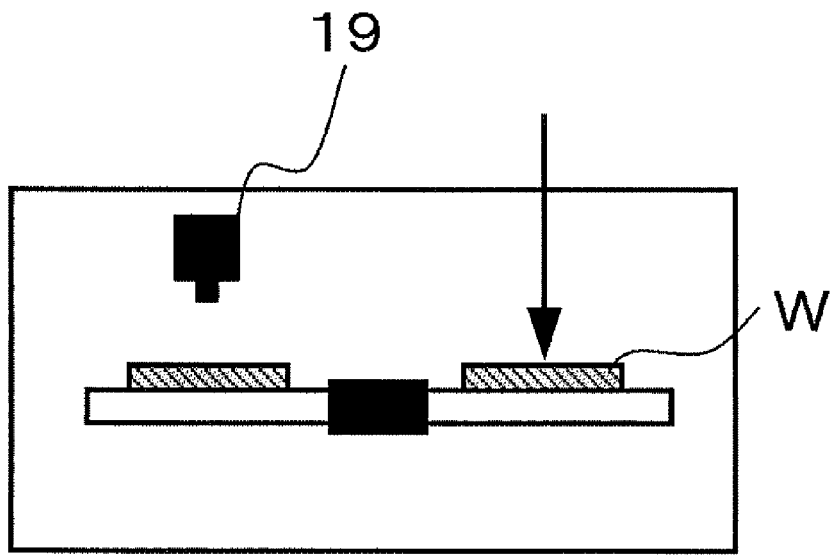
FIG. 6 is a schematic view of another embodiment of the method for checking an ion implantation condition of the present invention.

As shown in FIG. 5, the light emitted due to the irradiation of the ion beam 18 can be visually observed directly through the observation window 13. The observation method, however, is not limited thereto. As shown in FIG. 6, the emitted light may be checked by taking a video with the camera 19 provided in the chamber. The movement of the ion beam scanning can be inspected by image processing of the video.

As described above, observing the surface irradiated with the ion beam by using the camera reduces provability of failure of check, enabling the ion implantation condition to be more surely checked.

Figure 7:
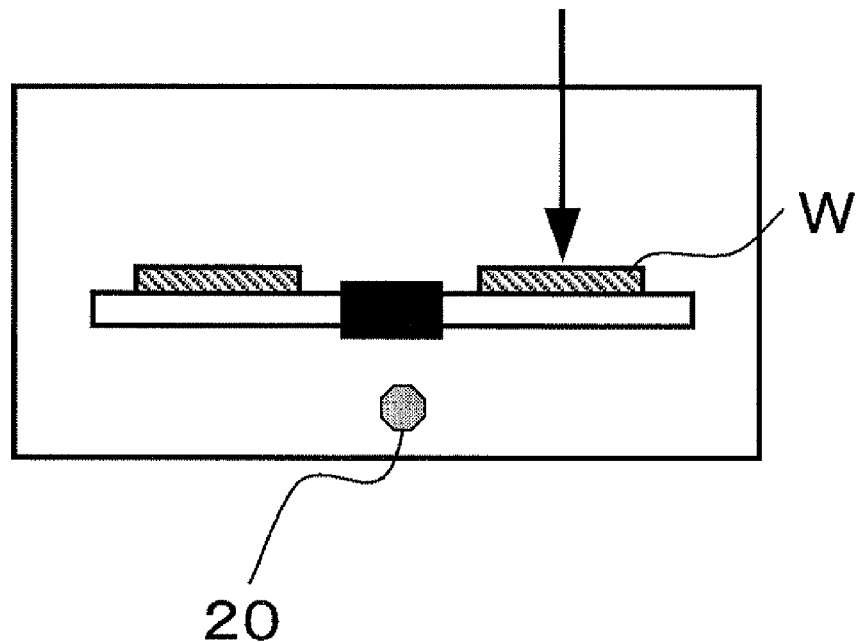
FIG. 7 is a schematic view of another embodiment of the method for checking an ion implantation condition of the present invention.

As shown in FIG. 7, the emitted light can be indirectly observed with an illuminometer 20 provided in the chamber for implanting the ions.

Figure 8:
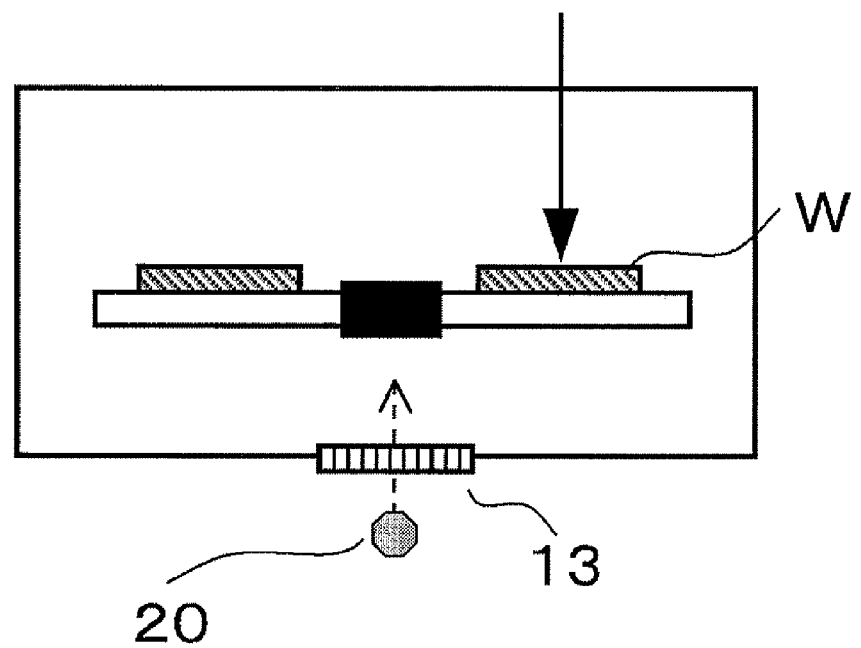
FIG. 8 is a schematic view of another embodiment of the method for checking an ion implantation condition of the present invention.

Alternatively, as shown in FIG. 8, the emitted light can be indirectly observed with an illuminometer 20 provided at a position at which the emitted light can be observed through the observation window 13 provided on the chamber for implanting the ions.

In some cases, the movement of the wheel cannot be observed directly through the observation window.

Examples of these cases include: a case where very narrow observation window makes it difficult to check the emitted light; since the beam line is also observed when the emitted light on the wafer surface is observed in a single wafer processing type ion implantation apparatus, it cannot be observed through the observation window for safety.

Since the light is emitted on the semiconductor wafer having the insulator film only while it is irradiated with the ion beam, however, the light brightens the interior of the chamber to some extent. In other words, when the beam does not completely pass through the wafer in reversing the scanning, weak blue light remains so that the interior of the chamber does not completely darken.

Accordingly, the presence of emitted light on the wafer surface can be indirectly checked by observing variation in luminous intensity of the interior of the chamber with the illuminometer. It is possible to check whether the scanning is properly performed by the variation in luminous intensity over time.

Here, at least one of hydrogen ions, heavy hydrogen ions, and helium ions may be used as the ions being implanted. Hydrogen molecule ions are also usable.

It is unnecessary to form these light element ions only from a hydrogen gas or a helium gas. For example, when hydrogen ions are implanted, a hydrogen ion beam can be obtained by producing hydrogen ions from a gas containing hydrogen, such as $PH_3$ and $AsH_3$, and taking out only the produced hydrogen ions with a mass spectrograph.

The phenomenon of the emitted light is not limited to the case of implanting the above light element ions. The insulator film formed on the surface of the semiconductor wafer is not limited to an oxide film. A film having insulation properties such as a nitride film may be used as the insulator film.

According to the method for checking an ion implantation condition of the present invention, the failure of the ion implantation can be readily detected and the production yield can be prevented from decreasing in both cases where the ion species making it possible to check the non-uniformity in ion implantation by the sheet resistance are used and where the non-dopant-type ion species making it impossible to check the non-uniformity in ion implantation when being implanted into a semiconductor wafer are used. In addition, the cause of the failure can be readily comprehended and stop time of the apparatus in abnormal operation can be reduced.

The step of implanting ions can be implemented while the semiconductor wafer is observed by the inventive method for checking an ion implantation condition to manufacture a semiconductor wafer.

As described above, according to the method for checking an ion implantation condition of the present invention, the ion implantation condition (the state of emitting light) of the semiconductor wafer into which the ions are being implanted can be observed readily, simply, and non-destructively. With the method for checking an ion implantation condition of the present invention, therefore, the incidence of failure in the step of implanting ions can be reduced by observing the step of implanting ion. In addition, when the failure occurs, the cause of the failure can be readily found and the yield can be improved in manufacture of a semiconductor wafer involving the step of implanting ions.

EXAMPLE

The present invention will be more specifically described below with reference to Examples, but the present invention is not limited to these examples.

Example 1

An oxide film having a thickness of 200 nm was formed on the surface of a silicon single crystal wafer having a diameter of 300 mm by the pyrogenic method.

The silicon single crystal wafer having the oxide film was then placed in the batch-type ion implantation apparatus (wheel actuated type). Hydrogen ions were implanted over the entirety of the wafer surface in conditions of an ion implantation energy of 100 keV (a beam current of 10 mA) and a dose amount of $8 \times 10^{16}/cm^2$. In this case, the beam was produced from a hydrogen gas.

In the ion implantation, the emitted light was visually observed through an observation window capable of observing the position spin-rotated and angularly spaced at an angle of 180° from the irradiation position of the ion beam (the position rotated at 180° about the center of the wheel on which the silicon single crystal wafer W was placed). As a result, it was confirmed that blue light remained on the outer circumferential portion of the silicon single crystal wafer at the ion irradiation position, and thus the light did not disappear at the outer circumferential portion of the wafer. The ions were implanted in this situation.

The silicon single crystal wafer, as the bond wafer, was then bonded to the base wafer of a silicon single crystal wafer having the same standard as the bond wafer. A delamination heat treatment (500° C., 30 minutes) was then performed to delaminate the bond wafer at a hydrogen ion implanted layer, thereby manufacturing an SOI wafer.

The surface roughness of the delaminated surface of the manufactured SOI wafer was measured. The surface roughness at the outer circumferential portion was approximately 1.5 times as large as that at the wafer center.

It was accordingly confirmed that the outer circumferential portion of the wafer lacked the dose amount.

The above results revealed that the movement system of the wheel in the batch-type ion implantation apparatus had a problem (its movement range differed from a desired range). Also, it was readily comprehended that a predetermined amount of ions were not implanted over the entirety of the surface of the silicon single crystal wafer, and its cause was the movement system of the wheel.

Example 2

The ion implantation was performed and an SOI wafer was manufactured in the same conditions as Example 1 except that an oxide film was formed with a thickness of 100 nm, the ion implantation energy was 50 keV, and a beam source was $PH_3$. The surface roughness of the delaminated surface of the manufactured SOI wafer was measured similarly with Example 1.

The observation of the light emitted in the ion implantation was performed with a camera provided in the chamber at a position angularly spaced at an angle of 180° from the irradiation position of the ion beam with respect to the center of the wheel on which the semiconductor wafer was placed.

As a result, it was confirmed that blue light did not disappear at the outer circumferential portion of the silicon single crystal wafer but remained on the surface at the ion irradiation position, as with Example 1.

It was also confirmed that the surface roughness at the outer circumferential portion was appropriately 1.5 times as large as that at the wafer center and thus the outer circumferential portion of the wafer lacked the dose amount, as with Example 1.

The above results revealed that the movement system of the wheel in the batch-type ion implantation apparatus had a problem (its movement range differed from a desired range).

Example 3

The ion implantation was performed and an SOI wafer was manufactured in the same conditions as Example 1 except that an oxide film was formed with a thickness of 150 nm, implanted ion species were helium, the ion implantation energy was 50 keV (a beam current of 15 mA), and the dose amount was $5 \times 10^{16}/cm^2$. The surface roughness of the delaminated surface of the manufactured SOI wafer was measured similarly with Example 1.

The observation of the light emitted in the ion implantation was performed with a camera provided outside the chamber through the observation window formed at a position angularly spaced at an angle of 180° from the irradiation position of the ion beam with respect to the center of the wheel on which the semiconductor wafer was placed.

As a result, it was confirmed that blue light did not disappear at the outer circumferential portion of the silicon single crystal wafer but remained on the surface at the ion irradiation position, as with Examples 1 and 2.

It was also confirmed that the surface roughness at the outer circumferential portion was approximately 1.5 times as large as that at the wafer center and thus the outer circumferential portion of the wafer lacked the dose amount, as with Examples 1 and 2.

The above results revealed that the movement system of the wheel in the batch-type ion implantation apparatus had a problem (its movement range differed from a desired range).

Example 4

The ion implantation was performed and an SOI wafer was manufactured in the same conditions as Example 3 except that an illuminometer was provided at a position at which a silicon single crystal wafer in the chamber was unable to be seen, and variation in brightness in the chamber was recorded with a chart recorder to observe the emitted light in the ion implantation. The surface roughness of the delaminated surface of the manufactured SOI wafer was measured similarly with Example 3.

As a result, it was confirmed that the interior of the chamber did not completely darken due to deviation in the reverse position of the beam scanning.

It was also confirmed that the surface roughness at the outer circumferential portion was approximately 1.5 times as large as that at the wafer center and thus the outer circumferential portion of the wafer lacked the dose amount, as with Examples 1 to 3.

The above results revealed that the movement system of the wheel in the batch-type ion implantation apparatus had a problem (its movement range differed from a desired range).

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:
1. A method for checking an ion implantation condition when ions are implanted over an entirety of one surface of a semiconductor wafer having an insulator film on the one surface, the method comprising:
   checking whether the ions are implanted over the entirety of the one surface of the semiconductor wafer by observing light emitted when the one surface of the semiconductor wafer is irradiated with an ion beam of the implanted ions throughout the ion implantation by any one of:
   (i) directly observing the emitted light using a batch-type ion implantation apparatus used to implant the ions in such a manner that the surface of the semiconductor wafer is observed through an observation window provided on a chamber of the batch-type ion implantation apparatus while the surface is irradiated with the ion beam, and the observation of the surface of the semiconductor wafer through the observation window is performed at a position angularly spaced at an angle of 90° to 270° from an irradiation position of the ion beam with respect to a center of a wheel on which the semiconductor wafer is placed;

(ii) indirectly observing the emitted light with an illuminometer provided in a chamber for implanting the ions; or (iii) indirectly observing the emitted light with an illuminometer provided at a position at which the emitted light can be observed through an observation window provided on a chamber for implanting the ions.

2. The method for checking an ion implantation condition according to claim 1, wherein at least one of hydrogen ions, heavy hydrogen ions, and helium ions are used as the ions.

3. The method for checking an ion implantation condition according to claim 2, wherein a batch-type ion implantation apparatus is used to implant the ions and the emitted light is directly observed.

4. The method for checking an ion implantation condition according to claim 2, wherein the emitted light is indirectly observed with the illuminometer provided in the chamber for implanting the ions.

5. The method for checking an ion implantation condition according to claim 2, wherein the emitted light is indirectly observed with the illuminometer provided at the position at which the emitted light can be observed through the observation window.

6. The method for checking an ion implantation condition according to claim 1, wherein a batch-type ion implantation apparatus is used to implant the ions and the emitted light is directly observed.

7. The method for checking an ion implantation condition according to claim 1, wherein the emitted light is indirectly observed with the illuminometer provided in chamber for implanting the ions.

8. The method for checking an ion implantation condition according to claim 1, wherein the emitted light is indirectly observed with the illuminometer provided at the position at which the emitted light can be observed through the observation window.

9. A method for manufacturing a semiconductor wafer comprising the step of implanting ions, wherein the ions are implanted into the semiconductor wafer while the semiconductor wafer is observed by the method for checking an ion implantation condition according to claim 1, in the step of implanting the ions.

10. A method for manufacturing a semiconductor wafer comprising the step of implanting ions, wherein the ions are implanted into the semiconductor wafer while the semiconductor wafer is observed by the method for checking an ion implantation condition according to claim 2, in the step of implanting the ions.

11. A method for manufacturing a semiconductor wafer comprising the step of implanting ions, wherein the ions are implanted into the semiconductor wafer while the semiconductor wafer is observed by the method for checking an ion implantation condition according to claim 6, in the step of implanting the ions.

12. A method for manufacturing a semiconductor wafer comprising the step of implanting ions, wherein the ions are implanted into the semiconductor wafer while the semiconductor wafer is observed by the method for checking an ion implantation condition according to claim 3, in the step of implanting the ions.

13. A method for manufacturing a semiconductor wafer comprising the step of implanting ions, wherein the ions are implanted into the semiconductor wafer while the semiconductor wafer is observed by the method for checking an ion implantation condition according to claim 7, in the step of implanting the ions.

14. A method for manufacturing a semiconductor wafer comprising the step of implanting ions, wherein the ions are implanted into the semiconductor wafer while the semiconductor wafer is observed by the method for checking an ion implantation condition according to claim 8, in the step of implanting the ions.

* * * * *